United States Patent
Okabe et al.

(10) Patent No.: US 6,949,434 B2
(45) Date of Patent: Sep. 27, 2005

(54) METHOD OF MANUFACTURING A VERTICAL SEMICONDUCTOR DEVICE

(75) Inventors: Yoshifumi Okabe, Nagoya (JP); Masami Yamaoka, Anjo (JP); Akira Kuroyanagi, Okazaki (JP)

(73) Assignee: Denso Corporation, Kariya (JP)

( * ) Notice: Subject to any disclaimer, the term of this patent is extended or adjusted under 35 U.S.C. 154(b) by 33 days.

(21) Appl. No.: 10/880,048

(22) Filed: Jun. 29, 2004

(65) Prior Publication Data

US 2004/0237327 A1 Dec. 2, 2004

Related U.S. Application Data

(62) Division of application No. 10/651,277, filed on Aug. 28, 2003, which is a division of application No. 10/283,981, filed on Oct. 30, 2002, now Pat. No. 6,649,478, which is a division of application No. 08/962,322, filed on Oct. 31, 1997, now Pat. No. 6,498,366, which is a division of application No. 08/409,900, filed on Mar. 22, 1995, now Pat. No. 5,689,130, which is a continuation of application No. 07/953,766, filed on Sep. 30, 1992, now abandoned, which is a division of application No. 07/652,920, filed on Feb. 8, 1991, now Pat. No. 5,242,862.

(30) Foreign Application Priority Data

Feb. 14, 1990 (JP) .............................. 2-33367

(51) Int. Cl.$^7$ .................. H01L 21/336; H01L 21/3205; H01L 21/44
(52) U.S. Cl. .................. 438/268; 438/586; 438/656; 438/665; 438/928; 438/977
(58) Field of Search .............................. 438/268, 656, 438/665, 928, 977, 586; 257/341

(56) References Cited

U.S. PATENT DOCUMENTS 3,858,238 A 12/1974 Nakamura et al.
3,879,230 A 4/1975 Nakamura et al.
4,751,191 A 6/1988 Gonsiorawski et al.
4,853,345 A 8/1989 Himelick (Continued)

FOREIGN PATENT DOCUMENTS

JP          57-15420       1/1982
JP          57-0907630     6/1982

(Continued)

OTHER PUBLICATIONS

"Semiconductor devices–Physics and technology" by Sze, 1985, p. 302.*

Krishina Shenai, "Vertical–Power DMOSFET", IEEE Elect. Device Letter, vol. No. 10, No. 3,/1989.

(Continued)

*Primary Examiner*—Steven Loke
(74) *Attorney, Agent, or Firm*—Harness, Dickey & Pierce, PLC (57) ABSTRACT

A method of manufacturing a vertical semiconductor device includes preparing a semiconductor wafer which has a heavily doped semiconductor substrate and a lightly doped semiconductor layer disposed over the semiconductor substrate, forming a semiconductor element at a surface portion of the semiconductor layer, forming a first metal layer for a first electrode of the semiconductor element over the surface portion of the semiconductor layer, grinding a back of the semiconductor substrate to thin the semiconductor substrate and roughen a back surface of the semiconductor substrate, performing a wet etching upon the back surface; and forming on the back surface a second metal layer for a second electrode of the semiconductor element.

18 Claims, 8 Drawing Sheets

U.S. PATENT DOCUMENTS

| | | | |
|---|---|---|---|
| 4,859,629 | A | 8/1989 | Reardon et al. |
| 4,879,250 | A | 11/1989 | Chan |
| 4,927,784 | A | 5/1990 | Kazior et al. |
| 4,931,412 | A | 6/1990 | Fischer et al. |
| 4,985,740 | A | 1/1991 | Shenai et al. |
| 5,065,216 | A | 11/1991 | Suzuki et al. |
| 5,077,143 | A | 12/1991 | Barraclough et al. |
| 5,241,862 | A | 9/1993 | Abbink et al. |
| 5,242,862 | A | 9/1993 | Okabe et al. |
| 5,333,961 | A | 8/1994 | Capigatti et al. |
| 5,338,961 | A | 8/1994 | Lidow et al. |
| 5,663,096 | A | 9/1997 | Okabe et al. |
| 5,689,130 | A | 11/1997 | Okabe et al. |
| 5,994,187 | A | 11/1999 | Okabe et al. |
| 6,114,193 | A | 9/2000 | Chang et al. |
| 6,498,366 | B1 * | 12/2002 | Okabe et al. ............... 257/341 |

FOREIGN PATENT DOCUMENTS

| | | |
|---|---|---|
| JP | 58-45814 | 10/1983 |
| JP | 59-189625 | 10/1984 |
| JP | 59-213140 | 12/1984 |
| JP | 59-220937 | 12/1984 |
| JP | 59-113629 | 6/1985 |
| JP | 61-230404 | 10/1986 |
| JP | 61-234041 | 10/1986 |
| JP | 61-296769 | 12/1986 |
| JP | 62-23170 | 1/1987 |
| JP | 62-43123 | 10/1987 |
| JP | 62-243332 | 10/1987 |
| JP | 62-293678 | 12/1987 |
| JP | 62-253633 | 10/1988 |
| JP | 1-169970 | 7/1989 |
| JP | 58-45814 | 10/1993 |
| JP | 59-220937 | 12/1994 |
| JP | 2-33367 | 10/1995 |
| JP | 63-253633 | 10/1998 |

OTHER PUBLICATIONS

Krishina Shenai, "Optimally Scaled Low–Voltage Vertical Power MOSFET's for High–Frequency Power Conversion", IEEE Trans. of ELect. DEvice vol. 37, No. 4,4/1990.

C.Y. Ting et al., The Use of Titanium–based Contact Barrier Layers in Silicon Technology:, Thin Solid Films, 96(1982) 327–345 Electronics and Optics.

Semiconductor Devices–Physics and Technology, Jan. 1985 S.M. Sze p. 307.

Alvin B. Phillips, "Transistor Engineering and Introduction to Integrated Semiconductor Circuits," p. 76.

S. Ogawa, et al. HRTEM and Non–Scale Micro Analysis of Titanium/Silicon Interfacial Reaction Correlated With Electrical Properties, Extended Abstract.

Wolf, et al. "Silicon Processing For The VLSI Era, vol. 1: Process Tech.", Lattice Press, 1986.

K. Shenai, et al. "Characteristics of As Deposited and Sintered Mo/LPCVD W Contacts to as, B, and P Doped Silicon", 1988 Materials Research Sociest, p. 219–224.

K. Shenai, et al., "Blanket LPCVD Tungsten Silicide Technology for Smart Power Applications", IEEE Electron Device Letters, vol. 10, No. 6 1989, p. 270–273.

K. Shenai, et al. "High–Performance Vertical–Power DMOSFET's with Selectively Silicided Gate and Source Regions", IEEE Electron Device Letters, vol. 10, No. 4 1989, p. 153–155.

K. Shenai, et al. "Selectively Silicided Vertical Power Double–Diffused Metal–Oxide Semiconductor Field Effect Transistors For High–Frequency Power Switching Applications", j. Vac. Sci. Technol. B6(6), 1988, p. 1740–1745.

H.R. Change, et al., "Selectively Silicided Vertical Power UMOSFET's with a Specific On–REsistance of", IEEE Transactions on Electron Devices, vol. ED–34, No. 11, 1987, p. 2329–2334.

K. Shenai, et al. "Selectively Silicided Vertical Power DMOSFET's for High–Frequency Power Conversion" Electronics Letters. vol. 25, No. 12, 1989, p. 784–785.

Webster's II New Riverside University Dictionary, 1984, p 549.

Semiconductor Devicea and Technology, by S.M. Sze, p. 38.

Office action dated Sep. 19, 2004 in co–pending U.S. Application No. 10/651,277.

"Semiconductor Devices —Physics and technology" by Sze, 1985, p. 302.

* cited by examiner

METHOD OF MANUFACTURING A VERTICAL SEMICONDUCTOR DEVICE

This application is a division of application Ser. No. 10/651,277 filed Aug. 28, 2003, which is a division of application Ser. No. 10/283,981 filed Oct. 30, 2002, now U.S. Pat. No. 6,649,478, which is a division of application Ser. No. 08/962,322 filed Oct. 31, 1997, now U.S. Pat. No. 6,498,366, which is a division of application Ser. No. 08/409,900 filed Mar. 22, 1995, now U.S. Pat. No. 5,689,130, which is a continuation of application Ser. No. 07/953,766 filed Sep. 30, 1992, now abandoned, which is a division of application Ser. No. 07/652,920 filed Feb. 8, 1991, now U.S. Pat. No. 5,242,862.

BACKGROUND OF THE INVENTION

1. Field of the Invention

This invention relates to a semiconductor device which has a low ON-resistance, and further, to a method of manufacturing such a semiconductor device.

2. Description of the Related Art

Many kinds of methods of manufacturing for reducing an ON-resistance of a semiconductor device have been known. For example, Japanese Unexamined Patent Publication 1-169970 discloses a method which an N-type impurity layer is formed in a back surface of a drain substrate so as to reduce a contact resistance between the drain substrate and a drain electrode. Japanese Examined Patent Publication 58-45814 discloses a method of manufacturing the semiconductor device which has a good ohmic contact between the drain substrate and the drain electrode. The device has a multilayer metal electrode on a back surface of a drain substrate. The multilayer metal electrode consists of layers having a gold layer as a main layer.

Figure 13:
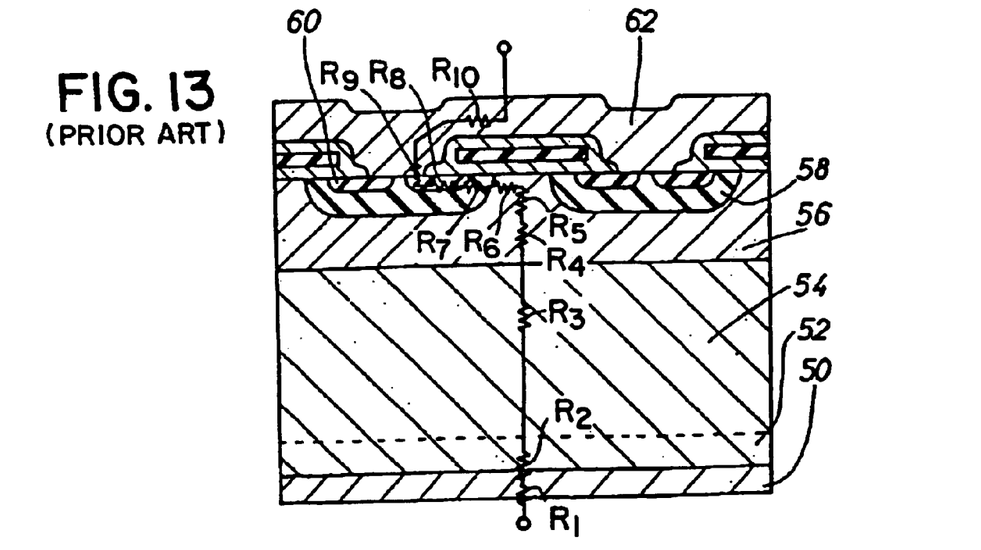
FIG. 13 is a sectional view of a semiconductor device of the prior art.

As shown in FIG. 13, the ON-resistance of a field effect transistor (FET) is represented by the following equation:

$$R_{ON} = R1 + R2 + R3 + R4 + R5 + R6 + R7 + R8 + R9 + R10$$

wherein, R1 denotes a contact resistance of a drain electrode 50; R2 denotes a contact resistance between the drain electrode 50 and an N-Type impurity layer 52; R3 denotes a resistance of N drain substrate 54; R4, R5 and R6 denote resistances of N drain region 56 respectively; R7 denotes a resistance of P-Type diffusion region 58 for forming a channel; R8 denotes a resistance of N-type source 60; R9 denotes a contact resistance between the N-Type source 60 and a source electrode 62; and R10 denotes a resistance of the source electrode 62.

However, such a conventional method of manufacturing the semiconductor device has many problems. For example, the method by which the N-Type impurity layer is formed is complex because an oxide film adhered to the back surface of the N drain substrate 54 and a diffusion layer having an opposite conductive type (P) to that of the N drain substrate 54 must be removed before the N-type impurity layer 52 is formed.

A semiconductor device for household use is demanded with a withstanding voltage more than 100V, normally more than 200V. It is a necessary to make a resistance of a epitaxial layer (the N drain region 56) formed on the N drain substrate 54 high to get the withstanding voltage. Therefore, the ratio of the resistance of the N drain substrate 54 to the resistance of the epitaxial layer becomes small. On the contrary, a semiconductor device for a motor vehicle is demanded with a withstanding voltage of at most 50–60V.

The resistance of the epitaxial layer is relatively low, and the ratio of the resistance of N drain substrate 54 to the resistance of the epitaxial layer becomes large. Therefore, in the semiconductor device for a motor vehicle, it is effective to reduce the resistance of the N drain substrate 54 for reducing the ON-resistance.

The resistance R3 of the N drain substrate 54 is represented by the following equation:

$$R3 = \rho_N \times t_n / S$$

wherein, $\rho_N$ denotes resistivity of the N drain substrate. 54; $t_n$ denotes a thickness of the N drain substrate 54; and S denotes a cross section of the N drain substrate 54. It is necessary to reduce the thickness $t_n$ of the N drain substrate 54 so as to reduce this resistance R3. However, the thickness $t_n$ of the N drain substrate 54 for forming the N-Type impurity layer 52 is determined in accordance with a thickness of a silicon wafer. The reason is that the N drain substrate 54 is warped by heat generated in a step that the N-Type impurity layer 52 is formed when the thickness $t_n$ of the N drain substrate 54 is too thin. To get a wafer of large diameter, the thickness $t_n$ needs to be thick to keep the strength thereof. Therefore, the resistance R3 of the N drain substrate 54 becomes high, and thus the ON-resistance also becomes high.

The technique by which the concentration of antimony (Sb) as a impurity in the N drain substrate 54 is heightened and the resistivity is diminished, may be adopted so as to reduce the resistance R3 of the N drain substrate 54. However, it is impossible to make the resistance R3 less than 0.01 Ω·cm because of the limitation of the amount solution of Sb which can be in the solution.

Moreover, since it is impossible to make the impurity concentration in the substrate high because of the limitation of solution, it is difficult to get a good ohmic contact between an N-type substrate and an electrode.

On the other hand, in the method which utilizes gold as an electrode material, the barrier height of the gold for an P-type silicon substrate is 0.2 eV, and therefore so a good ohmic contact between those can be obtained. However, since the barrier height of the gold for an N-type silicon substrate is relatively high, 0.8 eV, the contact between those becomes a schottky contact and may have undesirable diode character.

Moreover, when an overall thickness is thick, stress from a package and a step between a lead frame and the source electrode 62 becomes higher. Therefore, the wire bonding work becomes very difficult. Also, the cost of gold is very high.

Techniques other than the aforementioned techniques have also been known. The technique which is disclosed in Japanese Unexamined Patent Publication 57-15420 suggests that a back surface of a silicon substrate is ground to improve adherence between the back surface and a collector electrode formed on the back surface. The technique which is disclosed in "IEEE ELECTRON DEVICE LETTERS, VOL. 10, NO. 3 MARCH 1989, P101–103" suggests that a 0.004 Ω·cm arsenic-doped silicon substrate is used.

SUMMARY OF THE INVENTION

An object of this invention is to reduce the ON-resistance of a semiconductor device.

Another object of this invention is to get a good ohmic contact.

A still further object of this invention is to provide a thin semiconductor device having the advantage of small stress from a package and easy wire bonding.

To accomplish the above objects, a semiconductor device according to this invention includes an N-type semiconductor substrate including arsenic as an impurity and having a ground surface formed on one surface thereof, said ground surface having concavo-convex irregularities, a first electrode formed on another surface other than said one surface of said N-type semiconductor substrate, a second electrode formed on said ground surface and ohmically contacted with said N-type semiconductor substrate through said ground surface, and a semiconductor element formed in said N-type semiconductor substrate and in which an electric current flows between said first electrode and said second electrode during an ON-state thereof.

DESCRIPTION OF THE PREFERRED EMBODIMENTS

The preferred embodiments of this invention will be described with reference to the drawings. The embodiments are suitable for a semiconductor device for a motor vehicle.

Figure 1:
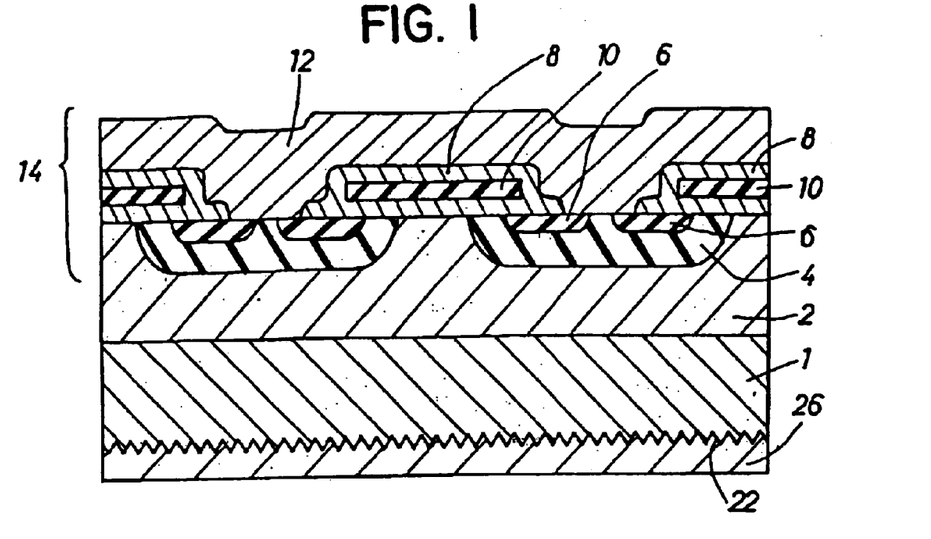
FIG. 1 is a sectional view of a semiconductor device of this invention.

FIG. 1 shows an N-type drain region 2 formed on a silicon substrate 1 which is doped with As (arsenic) formed by crystallizing melted silicon that has As therein. A P-type region 4 is formed in the N-type drain region 2 for forming a channel. An N-type source region 6 is formed in the P-type region 4. A polycrystalline silicon gate 10 is formed on the N-type drain region 2 and the P-type region 4 through an oxide film ($SiO_2$) 8. A source electrode 12 is formed on the oxide film 8 and electrically connected with the P-type region 4 and the N-type source region 6. An ohmic electrode 26 is formed on a ground surface 22 which is formed on a back surface of the silicon substrate 1.

Here, the prior art used Sb (antimony) as an-N-type impurity. However, the concentration of Sb could not be more than $5 \times 10^{18}$ cm$^{-3}$ owing to its limitation of solution. The inventors have solved this problem by including As in the silicon substrate 1 as the N-type impurity. As has a higher limitation of solution than Sb and therefore solves this problem. The concentration of As is set within a range between $7 \times 10^{18}$ cm$^{-3}$ ÷ $1 \times 10^{21}$ cm$^{-3}$ Therefore, the contact resistance between the silicon substrate 1 and the ohmic electrode 26 can be reduced sufficient to avoid a schottky contact and get an ohmic contact. Since the concentration of As is more than $7 \times 10^{18}$ cm$^{-3}$, a good ohmic contact can be obtained for almost all electrode materials. Moreover, the resistivity of the silicon substrate 1 is also diminished because of the higher concentration of As included in the silicon substrate 1 as an impurity. Consequently, the resistance R3 of the silicon substrate 1 is also reduced. The ground surface 22 has been ground to have a concavo-convex surface which has many coarse surface irregularities. Therefore, the ohmic electrode 26 can be firmly adhered to the ground surface 22 because the ground surface 22 has a suitable concavo-convex surface.

Figure 2A:
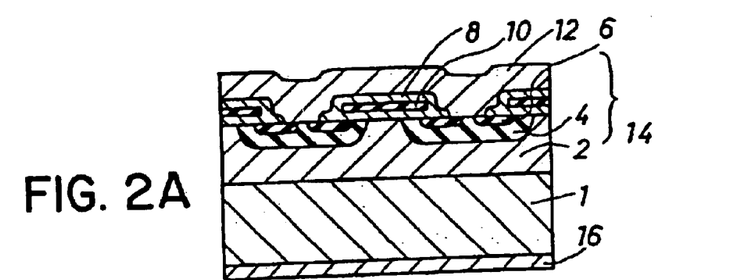
FIGS. 2A–2C are sectional views showing the sequence of processes of the semiconductor device of this of this invention.
Figure 2B:
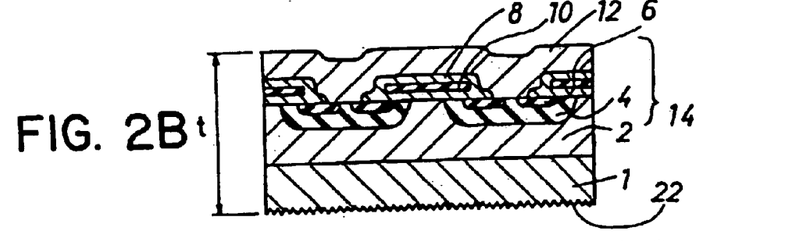
Figure 2C:
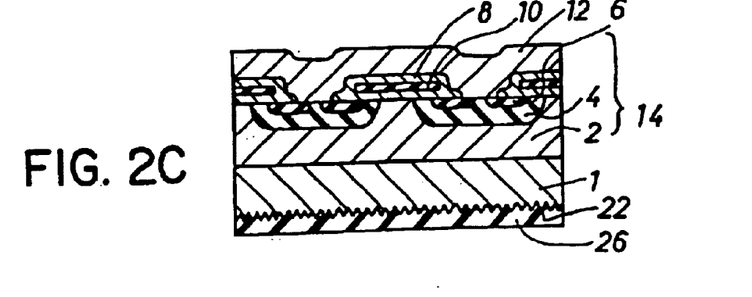

The process of forming the aforementioned semiconductor device of the embodiment of this invention will now be described with reference to FIGS. 2A–2C. FIGS. 2A–2C show the sequence of the process. A silicon crystal is formed by a CZ (Czochralski) method, where As is added as a dopant in a melted silicon. The silicon substrate 1 is formed by slicing the silicon crystal. Therefore the silicon substrate 1 has As a solid solution, the concentration of As being $7 \times 10^{18}$–$1 \times 10^{21}$ cm$^{-3}$, and resistivity of the silicon wafer is less than 0.008 Ω·cm. FIG. 2A shows the N-type drain region 2 having P (phosphorus) as an impurity and being grown on a main surface of the silicon substrate 1 by an epitaxial growth method. The oxide film ($SiO_2$) 8 is formed on a surface of the N-type drain region 2. The polycrystalline silicon is deposited on the oxide film 8 by an LPCVD (low pressure chemical vapor deposition) technique. P (phosphorus) is introduced in the polycrystalline silicon, and the polycrystalline silicon is locally etched to form the polycrystalline silicon gate 10. The polycrystalline silicon gate 10 is oxidized, and P-type impurities such as B (boron), Al (aluminium) Ga (gallium) or the like are diffused into the N-type drain region 2 by using this polycrystalline silicon gate 10 as a mask for forming the P-type region 4. A portion of the P-type region 4 becomes a channel region. The N-type source region 6 is formed by locally diffusing N-type impurities such as As, P (phosphorus) or the like into the P-type region 4. Windows are then opened in the oxide film 8 and Al—Si is deposited by a sputtering method for forming the source electrode 12, so that the source electrode 12 is connected to both the P-type region 4 and the N-type source region 6. Here, a device layer 14 consists of the P-type region 4, the N-type source region 6, the oxide film 8, the polycrystalline silicon gate 10, and the source electrode 12. Moreover, a passivation film such as a plasma-SiN or the like may be formed on the source electrode 12 for stabilizing a surface of the device layer 14.

Figure 3:
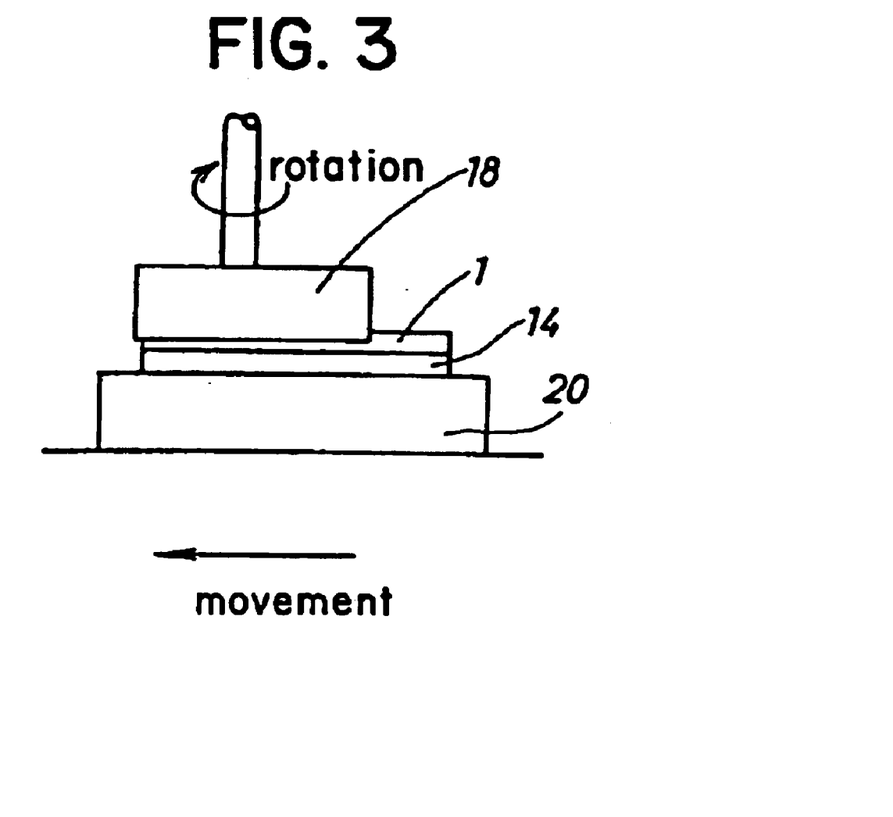
FIG. 3 is a side view for explaining a surface grinding proceeding.

During this process, a by-product layer 16, such as a polycrystalline silicon, a silicon oxide ($SiO_2$) or the like, is spontaneously formed on another (back) surface of the silicon substrate 1 while the aforementioned device is being manufactured. The another surface of the silicon substrate 1 on which the by-product layer 16 is formed thereon is ground by a surface grinding (SG) proceeding for removing the by-product layer 16. The surface grinding is carried out by using a grindstone 18 as shown in FIG. 3. The granularity of the grindstone 18 is between No. 300–No. 500. In this embodiment, a surface of the device layer 14 is covered with a adhesive film (not shown) and the device layer 14 is fixed by a vacuum chuck 20.

FIG. 2B shows the by-product layer 16 removed by the grinding, and a ground surface 22 being formed. In this condition, the thickness t from one surface of the device layer 14 to the another surface of the silicon substrate 1 is 200–450 $\mu$m. After grinding, the whole device is washed by super pure water.

Figure 5:
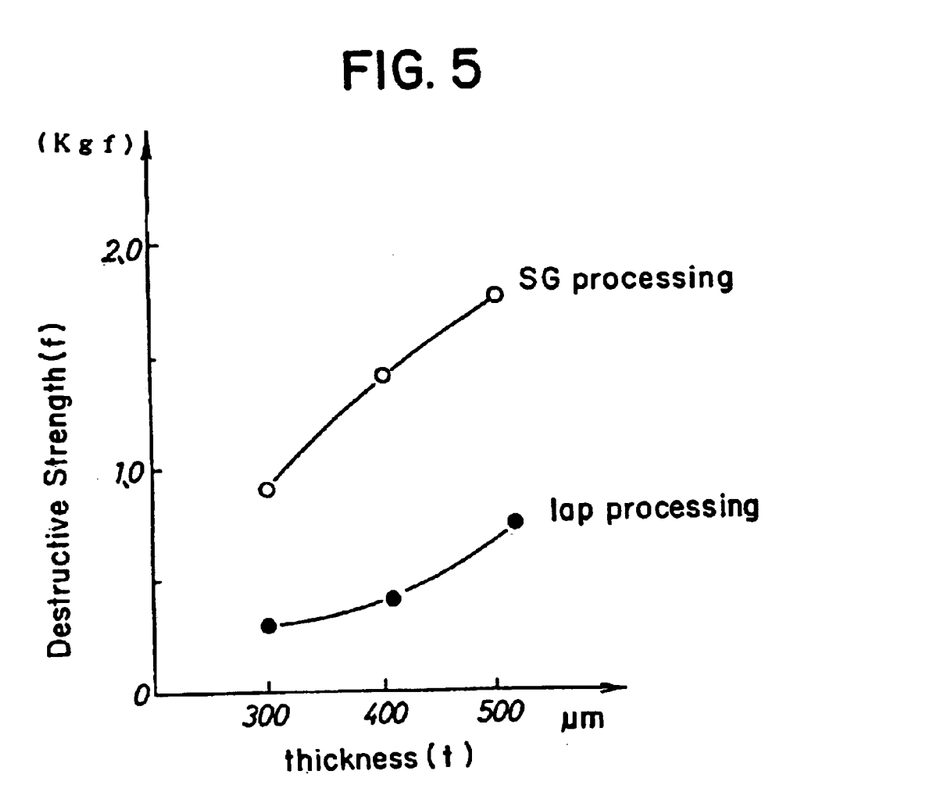
FIG. 5 shows a relationship between the thickness t and destructive strength.
Figure 6:
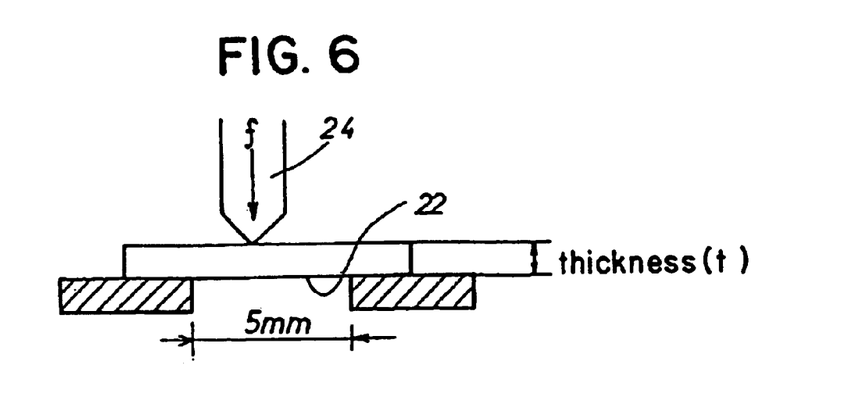
FIG. 6 is a sectional view for explaining a load test.

The silicon crystal of the another surface of the silicon substrate 1 is damaged by the grinding. This damage destroys some part of the crystalline structure of the silicon substrate, and should therefore be avoided. It also decreases the destruction strength. However, the depth of this damaged layer is only 1–2 $\mu$m if the surface grinding device of FIG. 3 is used. FIG. 5 shows a graph of depth of the damaged layer. Because the depth of the damaged layer is shallow, the destruction strength of this device is still between 1.0–1.6 kg. FIG. 6 shows a load test where the destruction strength is defined as a maximum load when a chip destroyed. The load test is carried out in such a way that the center of the chip is supported at its both ends and has a load applied thereon by a load piece 24.

Figure 4:
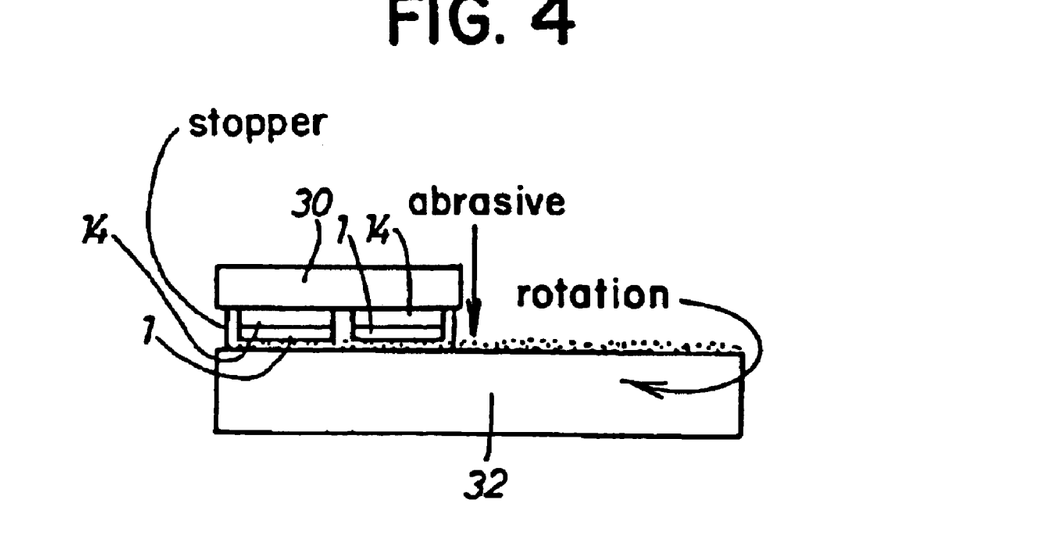
FIG. 4 is a side view for explaining a lapping grinding proceeding.

If the another surface of the silicon substrate 1 is ground by lapping grinding instead of surface grinding, the depth of the damaged layer is 6–7 $\mu$m, and the destruction strength of this device becomes 0.3–0.6 kg (shown in FIG. 5). FIG. 4 shows the lapping grinding is carried out in the condition which the device is fixed on upper surface plate 30 by paraffin glue and abrasives (a mix of abrasives No. 800 and No. 1200 of SiC) are supplied between the device and a lower surface plate 32. As understood by comparing the two lines in FIG. 5, surface grinding will make the destruction strength stronger than lapping grinding.

Figure 7:
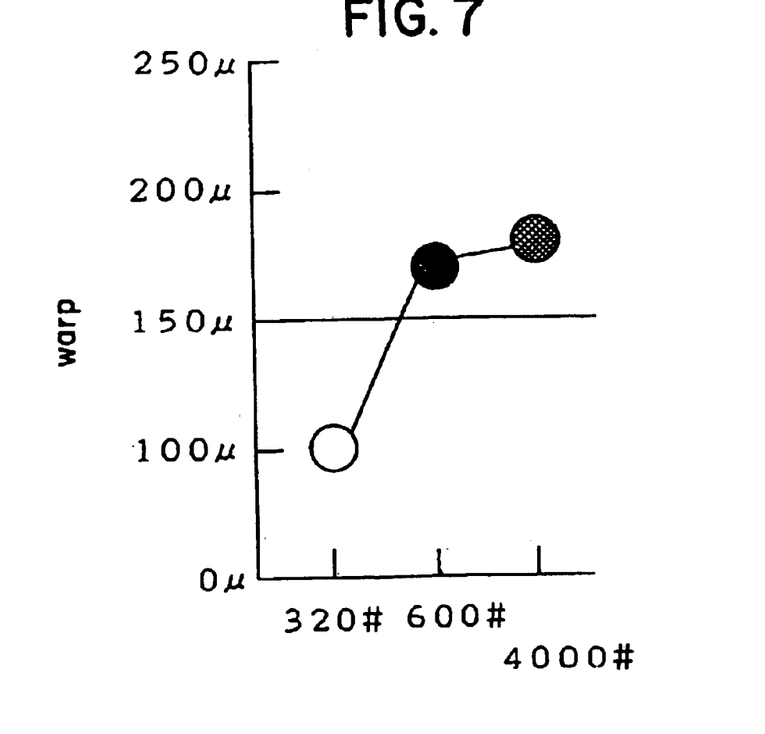
FIG. 7 shows a relationship between the granularity of a grindstone and warp of the silicon substrate.

FIG. 7 shows that when the granularity of the grindstone 18 is No. 300–No. 500, the warping of the silicon substrate 1 can be reduced. If the granularity is finer than No. 500, however the warp becomes larger. If the granularity is coarser than No. 300, the possibility which of breaking of the silicon substrate 1 is increased.

The reason why the warping is reduce is that the coarser the granularity is, the more stress in the silicon substrate is dispersed.

Figure 14:
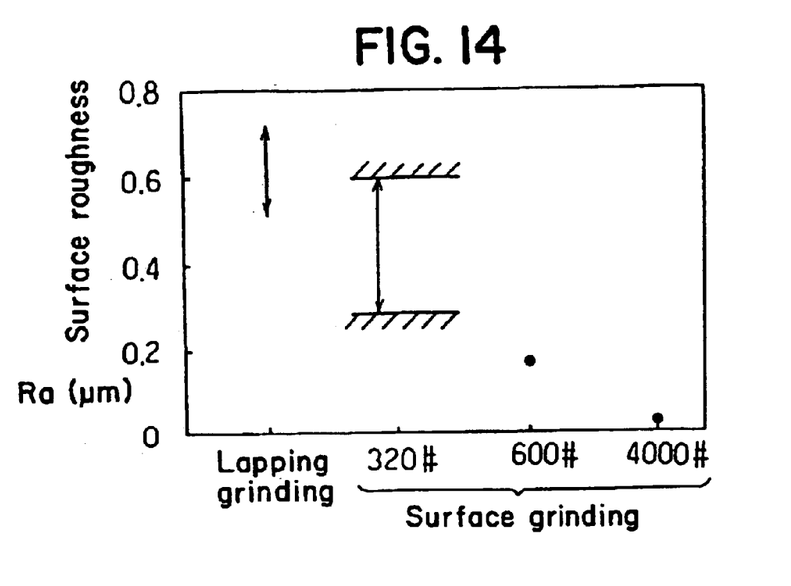
FIG. 14 shows a relationship between the granularity and surface roughness.

FIG. 14 shows a relationship between the granularity of the grindstone 18 and surface roughness Ra. When the granularity is No. 320, the surface roughness Ra is in a range between 0.3–0.6 $\mu$m. When the granularity is No. 600, the surface roughness Ra is almost 0, 2 $\mu$m. When the granularity is No. 4000, the surface roughness Ra becomes almost 0 $\mu$m. It is to be noted that surface roughness Ra of the silicon substrate 1 which is polished up is also almost 0 $\mu$m.

Figure 15:
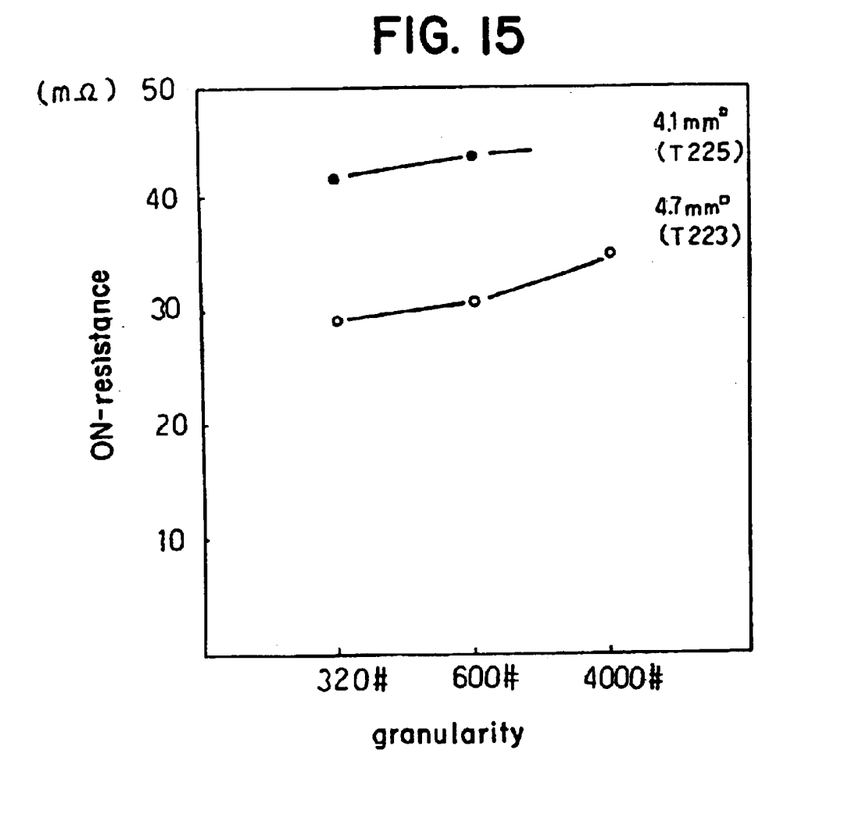
FIG. 15 shows a relationship between the granularity and an ON-resistance.

FIG. 15 shows a relationship between the granularity of the grindstone 18 and an ON-resistance. As shown in FIG. 15, when the granularity is coarser, the ON-resistance becomes low. The reason is that when the granularity is coarser, barrier height of the ohmic electrode 26 for the silicon substrate 1 becomes high, and the contact resistance between the ohmic electrode 26 and the silicon substrate 1. It is desirable that the granularity is a range between No. 320–No. 600 to reduce the ON-resistance.

Figure 8:
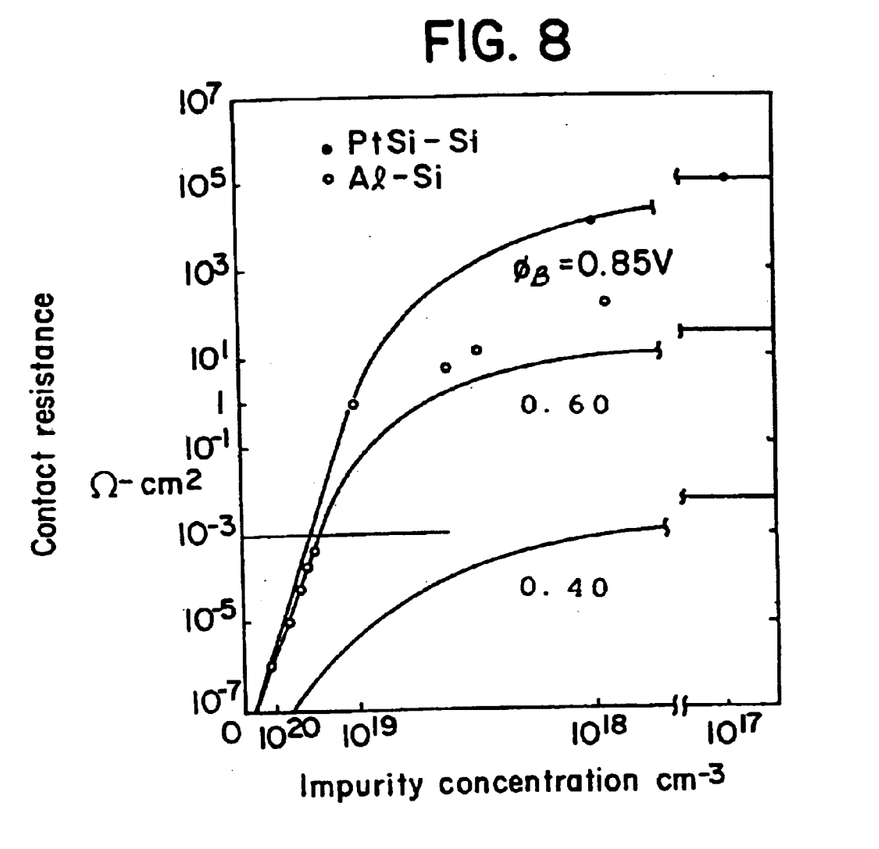
FIG. 8 shows a relationship between the impurity concentration and the contact resistance.

FIG. 2C shows that after a spontaneously formed layer (not shown) has been removed by a wet etching or an RF etching, an ohmic electrode 26 is formed on the ground surface 22 by a sputtering method. The ohmic electrode 26 acts as a drain electrode. In this embodiment, the ohmic electrode 26 is a multilayer electrode consisting of Ti—Ni—Au layers. When electrode material, such as Ti (titanium), V (vanadium), Cr (chromium), Ni (nickel) or the like, is adopted, it is necessary to make an impurity concentration in the silicon substrate 1 more than $5 \times 10^{18} \text{cm}^{-3}$, preferably, more than $7 \times 10^{18} \text{cm}^{-3}$ so as to make an ohmic contact with the electrode material. The barrier height $\phi_B$ of the electrode material for silicon is 0.4–0.6 eV. As shown in FIG. 8, if the impurity concentration is more than $5 \times 10^{18} \text{cm}^{-}$, the contact resistance between the electrode material and the silicon substrate 1 begins to rapidly be reduced, and if the impurity concentration is more than $7 \times 10^{18} \text{cm}^{-3}$, the contact resistance becomes less than $10^{-3}$ $\Omega \cdot \text{cm}^2$.

Figure 9:
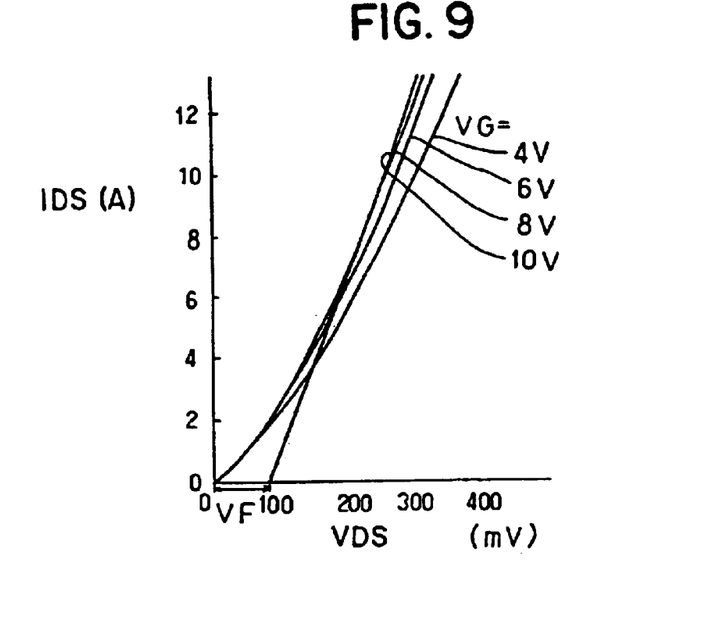
FIG. 9 shows a relationship between $V_{DS}$ and $I_{DS}$ of power MOS FET.

FIG. 9 shows a relationship between $V_{DS}$ (voltage between the source and the drain) and $I_{DS}$ (current between the source and drain) of this power MOS FET. Voltage of the gate $V_G$ is a parameter shown in Figure as being used as an index so as to judge whether the contact is a schottky contact.

Figure 10:
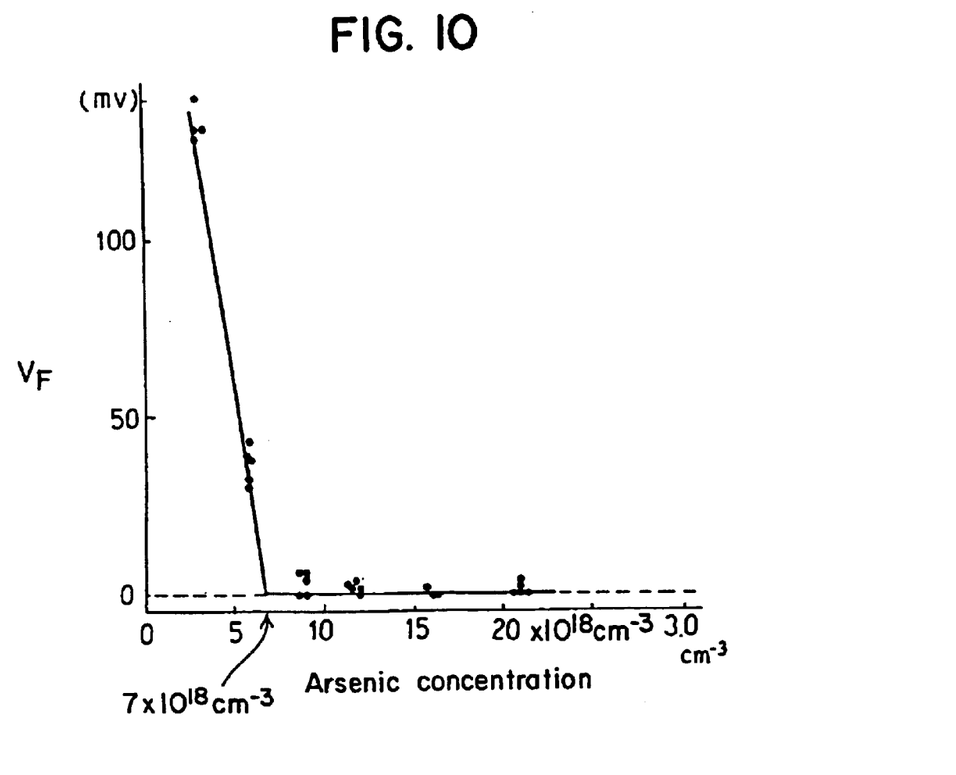
FIG. 10 shows a relationship between $V_F$ and the concentration of As in the silicon substrate.

FIG. 10 shows a relationship between this calculated $V_F$ and a concentration of As in the silicon substrate 1. As shown in FIG. 10, when the concentration of As is more than $7 \times 10^{18} \text{cm}^{-3}$, $V_F$ becomes substantially 0(zero) and the contact is an ohmic contact.

The upper limitation of the concentration of As which is included in the silicon substrate 1 is its limitation of solution. This limitation is found by measuring the value of leakage current through the P-N junction.

Figure 11:
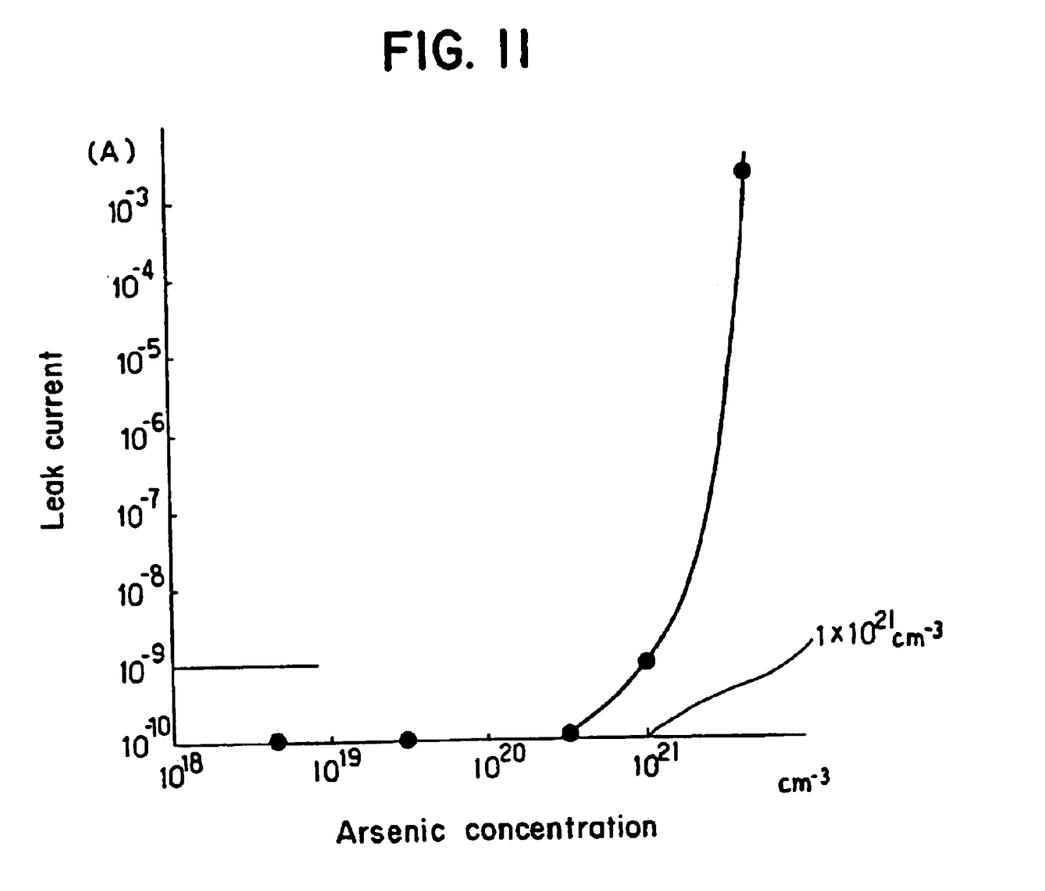
FIG. 11 shows a relationship between the concentration of As and the value of the leak current.

FIG. 11 shows a relationship between the concentration of As and the value of the leakage current through the P-N junction. Before the value of the leakage current is measured, to form P-N junction, a P-type impurity such as B(boron) or the like is diffused in an N-type silicon substrate including As as an impurity. When the concentration of As is higher than its limitation of solution, the crystallinity of silicon is disordered and leakage current flows through the P-N junction. Therefore, the concentration when the leakage current begins to flow is defined as the value of its limitation of solution. As shown in FIG. 11, the limitation of solution is $1 \times 10^{21} \text{cm}^{-3}$.

Figure 12:
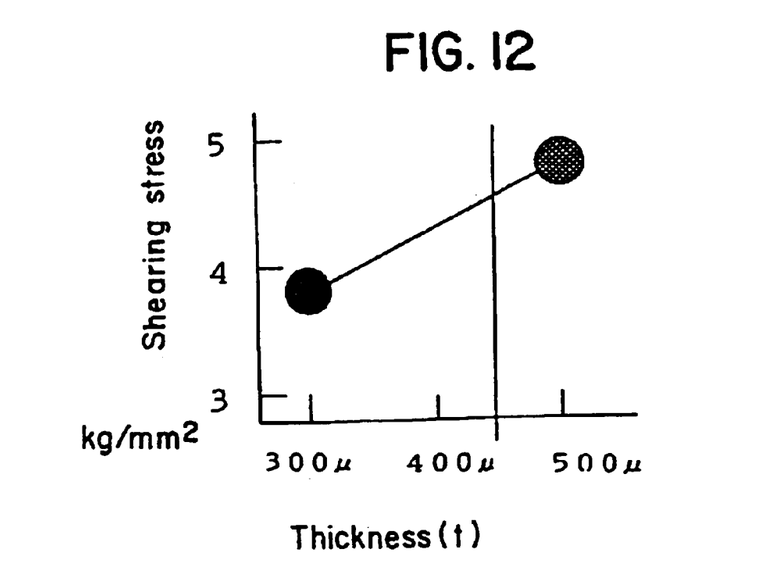
FIG. 12 shows a relationship between the thickness t and shearing stress.

The chip which was manufactured by abovementioned manufacturing steps is molded by silicone resin, and an IC package is formed. In this molding step, because a thickness of the chip is thin, as shown in FIG. 12, the shearing stress becomes low. Consequently, the stress of the IC package is relaxed. Moreover, when a lead frame (not shown) is bonded to the source electrode 12 with a wire, the wire-bonding work becomes easy because the height of the lead frame and the source electrode 12 are similar and therefore these makes a low step.

The present invention has been described with reference to the abovementioned embodiment, but the present invention is not limited to this embodiment and can be modified without departing from the spirit or concept of the present invention. For example, the present invention may be applied to an IGBT (Insulated Gate Bipolar Transistor), SIT (Static Induction Transistor), SI (State Induction) thyristor or the like other than the power MOSFET. These semiconductor elements flow current in a vertical direction (a direction of a thickness of a substrate) and an electrode formed on N-type silicon substrate.

What is claimed is:

1. A method of manufacturing a vertical type semiconductor device comprising:
preparing a semiconductor wafer which has a heavily doped semiconductor substrate and a lightly doped semiconductor layer disposed over said semiconductor substrate;

forming a semiconductor element at a surface portion of said semiconductor layer;

forming a first metal layer for a first electrode of said semiconductor element over said surface portion of said semiconductor layer;

grinding a back of said semiconductor substrate to thin said semiconductor substrate and roughen a back surface of said semiconductor substrate;

performing a wet etching upon said back surface; and forming on said back surface a second metal layer for a second electrode of said semiconductor element.

2. A method of claim 1, further comprising, after forming said second metal layer, packaging by molding technique a chip with said semiconductor element formed therein.

3. A method of claim 2, further comprising, prior to said packaging, wire-bonding between said first metal layer and a lead-frame.

4. A method of claim 2, wherein said grinding includes thinning said semiconductor substrate until a thickness from a surface of said first metal layer to said back surface, is 200–450 microns.

5. A method of claim 2, wherein said semiconductor substrate is an arsenic doped silicon substrate doped at an impurity concentration of between $7\times10^{18}$–$1\times10^{21}$ cm$^{-3}$.

6. A method of claim 1, wherein said grinding includes thinning said semiconductor substrate until a thickness from a surface of said first metal layer to said back surface is 200–450 microns.

7. A method of claim 6, wherein said semiconductor substrate is an arsenic doped silicon substrate doped at an impurity concentration of between $7\times10^{18}$–$1\times10^{21}$ cm$^{-3}$.

8. A method of claim 1, wherein said semiconductor substrate is an arsenic doped silicon substrate doped at an impurity concentration of between $7\times10^{18}$–$1\times10^{21}$ cm$^{-3}$.

9. A method of claim 1, wherein said second metal layer comprises a metal selected from a group consisting of titanium (Ti), vanadium (V), chromium (Cr) and nickel (Ni).

10. A method of claim 1, wherein said grinding includes roughening said back surface of said semiconductor substrate to have a surface roughness of between 0.2–0.6 microns.

11. A method of claim 1, wherein said semiconductor element includes a MOSFET formed at said surface portion of said semiconductor layer, said first electrode being a source electrode of said MOSFET, and said second electrode being a drain electrode of said MOSFET.

12. A method of manufacturing a vertical type semiconductor device comprising:

preparing a semiconductor wafer which has a heavily doped semiconductor substrate doped with arsenic as an impurity and a lightly doped semiconductor layer disposed over said semiconductor substrate;

forming a semiconductor element at a surface portion of said semiconductor layer;

forming a first metal layer for a first electrode of said semiconductor element over said surface portion of said semiconductor layer;

grinding a back of said semiconductor substrate to thin said semiconductor substrate and roughen a back surface of said semiconductor substrate, said grinding being performed until a thickness from a surface of said first metal layer to said back surface is 200–450 microns;

performing a wet etching upon said back surface; and forming on said back surface a second metal layer for a second electrode of said semiconductor element.

13. A method of claim 12, further comprising, after forming said second metal layer, packaging by molding technique a chip with said semiconductor element formed therein.

14. A method of claim 13, further comprising, prior to said packaging, wire-bonding between said first metal layer and a lead-frame.

15. A method of claim 12, wherein an arsenic concentration of said semiconductor substrate is between $7\times10^{18}$–$1\times10^{21}$ cm$^{-3}$.

16. A method of claim 12, wherein said second metal layer comprises a metal selected from a group consisting of titanium (Ti), vanadium (V), chromium (Cr) and nickel (Ni).

17. A method of claim 12, wherein said grinding includes roughening said back surface of said semiconductor substrate to have a surface roughness of between 0.2–0.6 microns.

18. A method of claim 12, wherein said semiconductor element includes a MOSFET formed at said surface portion of said semiconductor layer, said first electrode being a source electrode of said MOSFET, and said second electrode being a drain electrode of said MOSFET.

* * * * *